(12) United States Patent
Zhou

(10) Patent No.: US 12,156,344 B2
(45) Date of Patent: Nov. 26, 2024

(54) SYSTEMS AND METHODS OF 3D-PRINTING A CIRCUIT BOARD ON A HEAT SINK ASSEMBLY HAVING POWER DEVICES BONDED THERETO

(71) Applicant: TOYOTA MOTOR ENGINEERING & MANUFACTURING NORTH AMERICA, INC., Plano, TX (US)

(72) Inventor: Feng Zhou, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 413 days.

(21) Appl. No.: 17/371,220

(22) Filed: Jul. 9, 2021

(65) Prior Publication Data

US 2023/0012318 A1   Jan. 12, 2023

(51) Int. Cl.
| | |
|---|---|
| *H05K 3/12* | (2006.01) |
| *H05K 1/02* | (2006.01) |
| *H05K 7/20* | (2006.01) |
| *B33Y 10/00* | (2015.01) |
| *B33Y 50/00* | (2015.01) |
| *B33Y 80/00* | (2015.01) |

(52) U.S. Cl.
CPC ......... *H05K 3/1275* (2013.01); *H05K 1/0272* (2013.01); *H05K 7/205* (2013.01); *H05K 7/20509* (2013.01); *B33Y 10/00* (2014.12); *B33Y 50/00* (2014.12); *B33Y 80/00* (2014.12)

(58) Field of Classification Search
CPC .... H05K 3/1275; H05K 1/0272; H05K 7/205; H05K 7/20509; B33Y 10/00; B33Y 50/00; B33Y 80/00
See application file for complete search history.

(56) References Cited

U.S. PATENT DOCUMENTS

| | | | |
|---|---|---|---|
| 10,548,231 B2 * | 1/2020 | Knox | H05K 3/4685 |
| 10,779,451 B2 * | 9/2020 | Knox | B33Y 10/00 |
| 11,172,597 B2 * | 11/2021 | Richards | H01L 23/473 |
| 2012/0212907 A1 | 8/2012 | Dede | |
| 2013/0170171 A1 * | 7/2013 | Wicker | B33Y 70/00 29/832 |
| 2015/0197062 A1 * | 7/2015 | Shinar | B29C 64/182 700/98 |
| 2015/0197063 A1 | 7/2015 | Shinar et al. | |
| 2015/0289413 A1 * | 10/2015 | Rush | B22F 10/20 165/53 |
| 2016/0351468 A1 | 12/2016 | Liang | |
| 2018/0160525 A1 * | 6/2018 | Satake | H05K 7/205 |
| 2018/0184550 A1 * | 6/2018 | Jenkins | B33Y 80/00 |

(Continued)

FOREIGN PATENT DOCUMENTS

| | | |
|---|---|---|
| CN | 107388854 A | 11/2017 |
| CN | 111133843 A | 5/2020 |

(Continued)

*Primary Examiner* — Jeffrey T Carley
(74) *Attorney, Agent, or Firm* — Dinsmore & Shohl LLP

(57) ABSTRACT

A method of forming integrated power electronics packages by 3D-printing the PCB on and around power devices includes bonding a power device to a first surface of a cold plate and printing, using a 3D-printer, a circuit board on and around the power devices such that the circuit board includes one or more insulating portions and one or more conductive portions.

9 Claims, 8 Drawing Sheets

(56) References Cited

U.S. PATENT DOCUMENTS

| | | |
|---|---|---|
| 2019/0122897 A1* | 4/2019 | Barry ..................... H01L 24/82 |
| 2020/0185302 A1 | 6/2020 | Lu et al. |
| 2021/0105911 A1* | 4/2021 | Yang ................. H05K 7/20509 |
| 2021/0242105 A1* | 8/2021 | Reyes Schuldes ......................... H01L 21/4814 |
| 2022/0190464 A1* | 6/2022 | Gavagnin .............. B33Y 10/00 |

FOREIGN PATENT DOCUMENTS

| | | | | |
|---|---|---|---|---|
| DE | 102018100468 A1 | 7/2018 | | |
| KR | 20100132408 A * | 8/2009 | | |
| WO | WO-2014209994 A2 * | 12/2014 | ............. | B29C 64/00 |
| WO | WO-2018091290 A1 * | 5/2018 | ............. | H01L 23/46 |

\* cited by examiner

SYSTEMS AND METHODS OF 3D-PRINTING A CIRCUIT BOARD ON A HEAT SINK ASSEMBLY HAVING POWER DEVICES BONDED THERETO

TECHNICAL FIELD

The present specification generally relates to systems and methods of forming an integrated power electronics package that includes a PCB on and/or around power devices that are bonded to a heat sink assembly.

BACKGROUND

Electric vehicles, robotic systems, and other electronically driven devices utilize power electronics packages to convert and deliver power to system components from an energy source and vice versa, for example, in applications that include systems such as regenerative braking. Compact power electronic packages that are capable of delivering high power are needed, for example, in the ever-advancing electric vehicle and electrically powered device market. Compact integrated power devices embedded within driver boards such as printed circuit boards (PCBs) formed using lamination and machining processes have delivered high power density power designs. However, limitations arising from the lamination and machining processes of forming PCBs and embedding power devices therein are ripe for improvement and innovation enabling delivery of integrated power electronic packages that reach upwards of and/or exceed 400 kW/L at 80 kW or higher.

SUMMARY

In one aspect, a method includes bonding a power device to a first surface of a cold plate and printing, using a 3D-printer, a circuit board on and around the power devices such that the circuit board includes one or more insulating portions and one or more conductive portions.

In some aspects, a device includes a cold plate, a power device bonded to a first surface of the cold plate, and a circuit board 3D-printed on and around the power device bonded to the first surface of the cold plate, wherein the circuit board includes one or more insulating portions and one or more conductive portions.

In some aspects, a system includes a 3D-printer communicatively coupled to an electronic controller. The electronic controller is configured to transmit a set of 3D-printing instructions to the 3D-printer for 3D-printing a circuit board on a first surface of a cold plate having a power device bonded thereto and cause the 3D-printer to deposit insulating material and conductive material according to the 3D-printing instructions on and around the power device bonded to the cold plate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
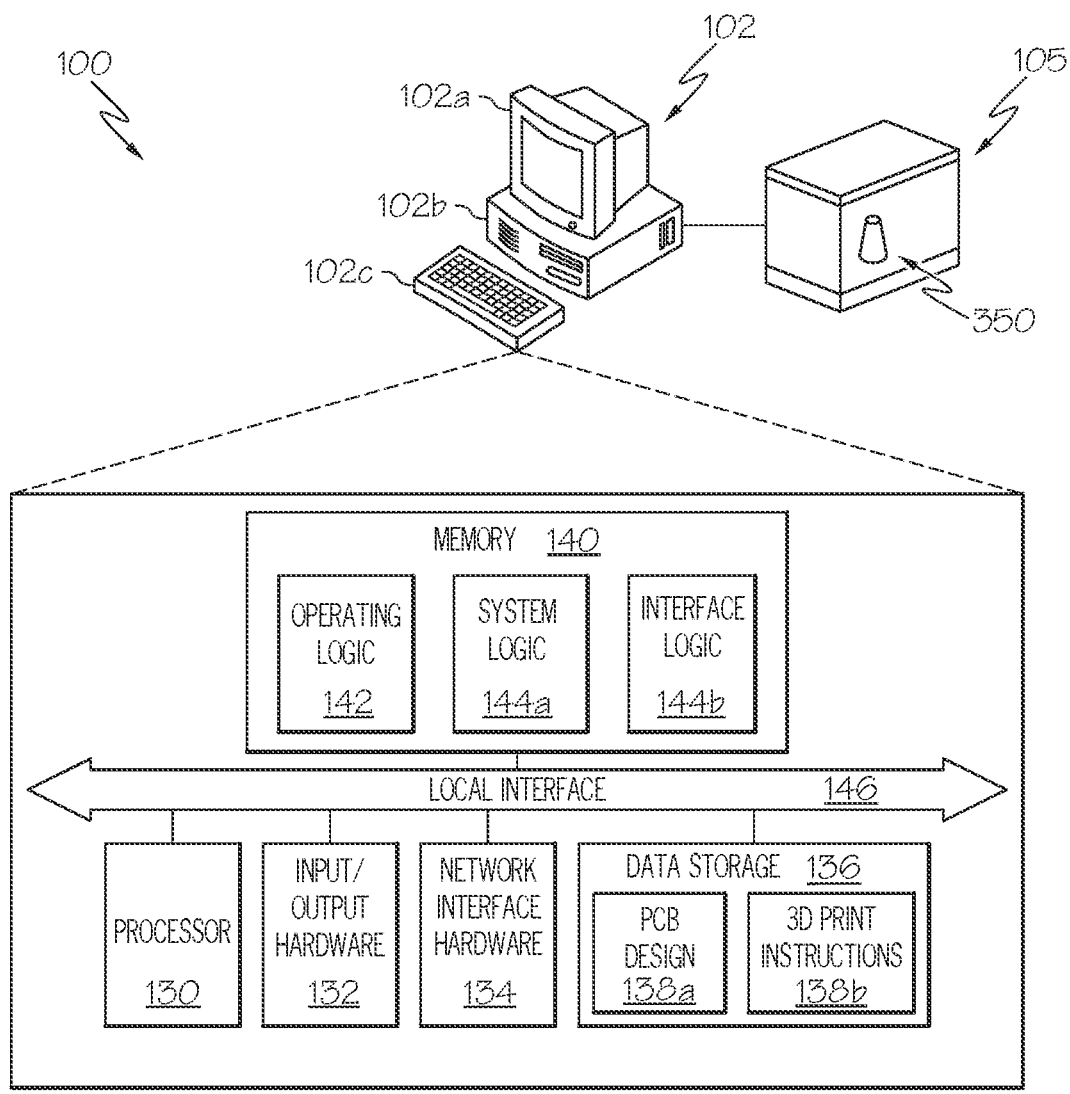
FIG. 1 depicts an illustrative system having an electronic controller for forming an integrated power electronics package by 3D-printing the PCB on and/or around power devices that are bonded to a heat sink assembly according to one or more embodiments shown and described herein.

Embodiments disclosed herein relate to systems and methods of forming integrated power electronics packages by 3D-printing a PCB on and/or around power devices. More specifically, the present disclosure includes an integrated power electronics package having a power density that approaches or exceeds a power density of 400 kW/L or greater at 80 kW and methods of forming the integrated power electronics package by 3D-printing the PCB on and/or around the bonded power device and heat sink assembly. In some embodiments, the power devices may be bonded to a cold plate having a heat sink device and the PCB may be 3D-printed on the cold plate and/or around the power devices bonded thereto.

As described in more detail herein, the disclosed PCB may be directly 3D-printed on a cold plate instead of making the PCB using traditional lamination methods, which is then assembled by bolting the PCB to the cold plate. Unlike traditional methods of making a PCB that use laser drilling and electroplating to make the copper vias which can restrict the size of the vias and aspect ratio of the vias to be small, 3D-printing the PCB directly on the cold plate enables the PCB to have an asymmetric geometry. For example, the process of 3D-printing a PCB on and around the power devices as described in detail herein enable the power devices may be seamlessly embedded within the PCB.

Furthermore, a 3D-printing device may be configured to deposit conductive, insulating, and supporting materials to form a PCB without being constrained by the layer-by-layer processes associated with lamination processes of forming PCBs. For example, traditional lamination processes of forming PCBs include laminating layers of conductive and insulating material together forming a multi-layer structure where each layer includes a defined thickness and planar layout. Furthermore, adjacent conductive layers that are separated by a layer of insulation material require conductive vias, which are mechanically formed through the layer of insulation material to be electrically and/or thermally coupled. Such vias are typically formed by laser drilling and electroplating the laser drilled hole to form conductive vias. These conductive vias are typically constrained to a vertical orientation. That is, the vias extend from one conductive layer of material (e.g., a first plane) through one or more additional layers including at least one layer of insulation material (e.g., a second plane) to a second conductive layer of material (e.g., a third plane). Each of the first, second, and third planes are generally parallel to each other in a stacked orientation.

Alternatively, 3D-printed PCBs eliminate the aforementioned layer-by-layer formation constraints involved in the traditional lamination process and machining processes of forming a PCB. Instead, a 3D-printing device is capable of printing both conductive material and insulation material within a single layer. Additionally, the 3D-printing device is capable of varying all three dimensions of a conductive portion of the PCB in X, Y, and Z directions as the conductive portion is formed. Accordingly, instead of forming a plurality of relatively small vias between conductive layers within a laminated PCB to provide electrical and/or thermal conductive paths, a 3D-printed PCB may be formed with a single large conductive portion. The single large conductive portion reduces the electrical and thermal resistance paths within the PCB by eliminating unnecessary layers between the embedded power devices and the cold plate or other heat-extracting surface of the PCB. Additionally, conductive paths formed using 3D-printing processes are not limited to conductive planes and generally perpendicular intersects (e.g., vias) to interconnect the parallel planes of conductive material. 3D-printed conductive paths formed within the 3D-printed PCB may have any shape in the X, Y, and Z directions and are not constrained by parallel planes and perpendicular conductive via orientations. As a result, a 3D-printed PCB may be thinner and more efficient with respect to heat transfer through the 3D-printed PCB as compared to a laminated PCB. For example, current laminated PCBs having embedded power devices can achieve a power density of about 160 kW/L to about 300 kW/L at 80 kW, whereas a 3D-printed PCB approaches and/or exceeds 400 kW/L at 80 kW. Moreover, the electrical circuits (e.g., the electrically conductive paths) to connect the embedded power device have more freedom and do not have to be formed layer-by-layer with layers being connected by vias.

As used herein, the term "conductive" refers to electrically conductive and/or thermally conductive unless specifically specified.

Embodiments of the systems and methods of forming integrated power electronics packages by 3D-printing the PCB on and/or around power devices and integrated power devices formed thereof will now be described in more detail herein. The following will now describe these systems, methods, and devices in more detail with reference to the drawings and where like numbers refer to like structures.

Referring to FIG. 1, an illustrative system 100 having an electronic controller 102 for forming an integrated power electronics package by 3D-printing the PCB on and/or around power devices that are bonded to heat sink assembly is depicted. In some embodiments, the system 100 includes an electronic controller 102 such as a computing device communicatively coupled to a 3D-printer 105. The electronic controller 102 may include a display 102a, a processing unit 102b and an input device 102c, each of which may be communicatively coupled to one another. The electronic controller 102 may be a server, a personal computer, a laptop, a tablet, a smartphone, a handheld device, or a similar computing device. The electronic controller 102 may be used by a user of the system to provide information to the system. For example, the user may be a design engineer, a manufacturing technician, a quality control person, or the like. The electronic controller 102 may utilize a local application, a web application, or the like to access the 3D-printer 105 that is communicatively coupled to the electronic controller 102 as described herein. The system may also include one or more data servers (not shown) having one or more databases, from which PCB designs, 3D-print instructions or the like (e.g., computer-aided design (CAD) files or the like) may be queried, extracted, updated, and/or utilized by the electronic controller 102.

The electronic controller 102, which is described in more detail herein, may be configured to host applications and execute processes related to the system described herein. It should be understood that while an electronic controller 102 and a 3D-printer 105 are depicted in the illustrative system 100 in FIG. 1, each of the functions and operations performed by the electronic controller 102 may be embodied and deployed in a distributed computing environment having a plurality of electronic controllers 102 and a plurality of 3D-printers 105. It is also understood that while the electronic controller 102 is depicted as a personal computer, this is merely an example. In some embodiments, any type of computing device (e.g., mobile computing device, personal computer, server, and the like) may be utilized for any of these components. Moreover, in some embodiments, the electronic controller 102 may be a component of the 3D-printer 105.

The electronic controller 102 includes a processor 130, input/output hardware 132, network interface hardware 134, a data storage component 136, which may store a database of PCB designs 138a, and a database of 3D-printer instructions corresponding to one or more of the PCB designs 138a, and a memory component 140. The memory component 140 may be machine-readable memory (which may also be referred to as a non-transitory processor readable memory). The memory component 140 may be configured as volatile and/or nonvolatile memory and, as such, may include random access memory (including SRAM, DRAM, and/or other types of random access memory), flash memory, registers, compact discs (CD), digital versatile discs (DVD), and/or other types of storage components. Additionally, the memory component 140 may be configured to store operating logic 142, system logic 144a for implementing one or more of the methods described herein, and interface logic 144b for implementing an interactive interface between a user and the system 100 (each of which may be embodied as a computer program, firmware, or hardware, as an example). A local interface 146 is also included in FIG. 1 and may be implemented as a bus or other interface to facilitate communication among the components of the electronic controller 102.

The processor 130 may include any processing component(s) configured to receive and execute programming instructions (such as from the data storage component 136 and/or the memory component 140). The instructions may be in the form of a machine-readable instruction set stored in the data storage component 136 and/or the memory component 140. The input/output hardware 132 may include a monitor, keyboard 102c, mouse, printer, camera, microphone, speaker, and/or other device for receiving, sending, and/or presenting data. The network interface hardware 134 may include any wired or wireless networking hardware, such as a modem, LAN port, Wi-Fi card, WiMax card, mobile communications hardware, and/or other hardware for communicating with other networks and/or devices.

It should be understood that the data storage component 136 may reside local to and/or remote from the electronic controller 102 and may be configured to store one or more pieces of data for access by the electronic controller 102 and/or other components. As illustrated in FIG. 1, the data storage component 136 may store a database of PCB designs 138a, and a database of 3D-printer instructions corresponding to one or more of the PCB designs 138a.

The database of PCB designs 138a may include CAD files or the like defining the conductive portions and the insulation portions of a PCB as well as the positions of the embedded power devices and optionally the cold such that a PCB may be 3D-printed on and/or around the cold plate and embedded power devices. The data storage component 136 also includes a database of 3D-printer instructions corresponding to one or more of the PCB designs 138a. The 3D-printer instructions may be generated by the electronic controller 102 or another computing system. The 3D-printer instructions include the specific motion and deposition instructions for a predetermined 3D-printer model such that the 3D-printer can build the PCB according to the PCB design 138a defined by a user.

The system 100 further includes a 3D-printer 105 communicatively coupled to the electronic controller 102. The 3D-printer 105 may be any rapid-prototyping, rapid manufacturing device, or additive manufacturing device such as a material jet (MJ), a binder jet (BJ), a drop on demand (DOD), fused deposition modeling (FDM), stereolithography (SLA), digital light processing (DLP), selective laser sintering (SLS), selective laser melting (SLM), laminated object manufacturing (LOM), electron beam melting (EBM), and/or the like type 3D-printer. The 3D-printer 105 may include a processor and memory and other electronic components for receiving 3D-printing instructions 138b for printing a PCB design 138a. The 3D-printing instructions 138b are a design configuration file corresponding to the PCB design 138a for printing which may be uploaded to the 3D-printer 105.

In some embodiments, the system 100 may be implemented through the interconnectivity of multiple devices, for example, through a network where the electronic controller 102 and the 3D-printer 105 may be collocated or at different locations. In other embodiments, the system 100 is implemented through an electronic controller 102 that is communicatively coupled to the 3D-printer 105. Regardless of the implementation of the system 100, the electronic controller 102 may utilize hardware, software, and/or firmware, according to embodiments shown and described herein. While in some embodiments, the electronic controller 102 may be configured as a general-purpose computer with the requisite hardware, software, and/or firmware, in some embodiments, the electronic controller 102 may be configured as a special purpose computer designed specifically for performing the functionality described herein.

Figure 2:
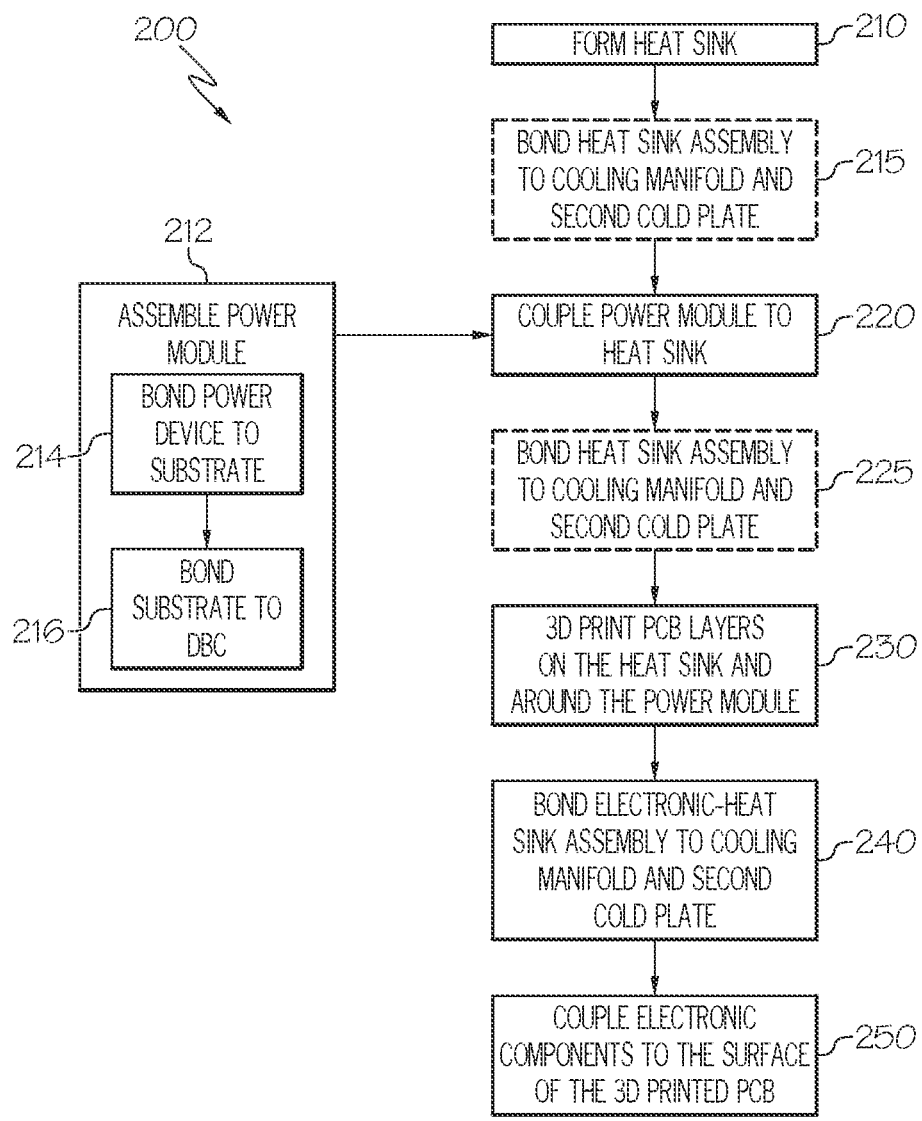
FIG. 2 a flow diagram of an illustrative method for forming an integrated power electronics package by 3D-printing the PCB on and/or around power devices that are bonded to a heat sink assembly according to one or more embodiments shown and described herein.

Turning to FIG. 2, an illustrative flow diagram of an illustrative method 200 for forming an integrated power electronics package using a 3D-printer to build the PCB on and/or around power devices that are bonded to heat sink assembly is depicted. The method of forming the integrated power electronics package described herein provides an improvement in the power density and thermal management of the integrated power electronics package. The method of forming the integrated power electronics package eliminates PCB via layers to transfer heat from the power device and a bottom surface of the PCB, eliminates grease layers or any other thermal interface material (TIM) layers between the PCB and any external insulations and between the insulation layer and a cold plate, embeds electrical insulation layers in the PCB so that no external insulation layers is needed, and enables the formation of asymmetric insulation portions and conductive portions within the PCB enabling single conductive vias to be formed in place of a plurality of small vias extending between parallel conductive layers of a laminated PCB. Additionally, the volume of the integrate power module, which includes the integrated power electronics package coupled to a cooling manifold, is decreased by implementing an ultra-thin cold plate design with inlet and outlet pipes optionally perpendicular to cold plate and reducing unnecessary layers between the power device and the cooling manifold.

Figure 3:
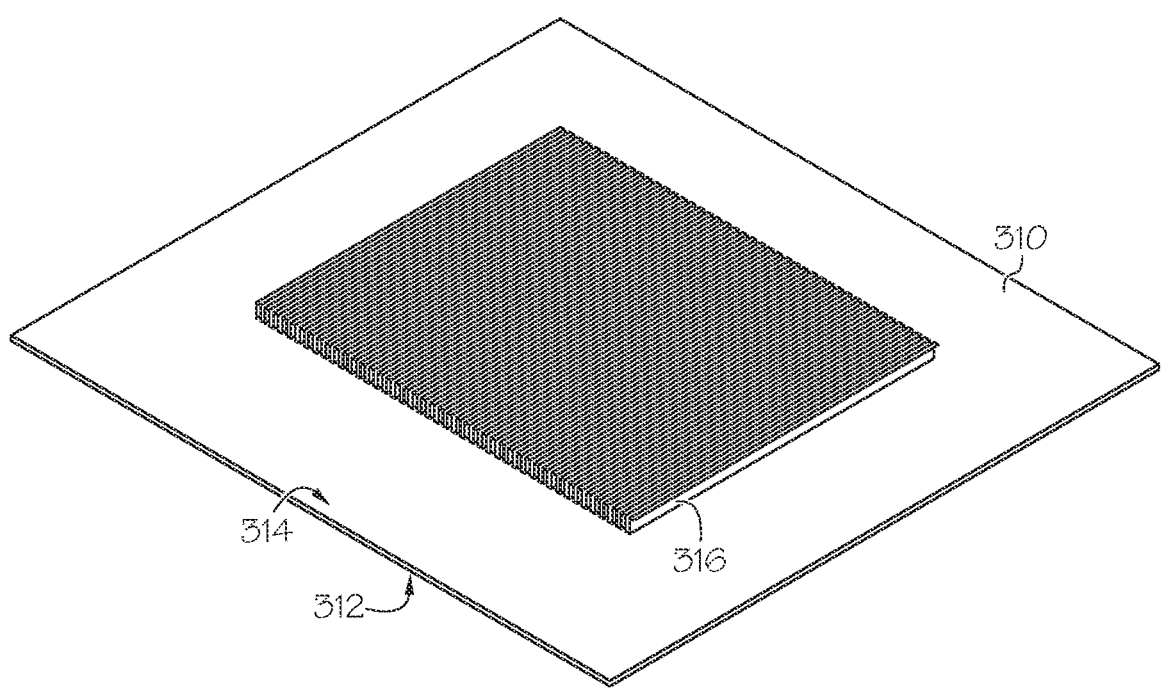
FIG. 3 depicts a bottom perspective view of an illustrative heat sink assembly according to one or more embodiments shown and described herein.

The method 200 for forming the integrated power module 400 (FIG. 6A) having an integrated power electronics package 300 (FIG. 5A) using a 3D-printer 105 to build the PCB on and/or around power devices 332 (FIG. 5B) that are bonded to the cold plate 310 (FIG. 5A) will now be described. The method 200 will be described with reference to the components of the integrated power electronics package 300 and integrated power module 400 depicted in FIGS. 3, 4A, 4B, 5A, 5B, 6A, 6B, and 7. Referring to block 210 of FIG. 2 and FIG. 3 depicting a bottom perspective view of an illustrative heat sink assembly, a heat sink 316 is formed and bonded to a cold plate 310. In some embodiments, the heat sink 316 include microchannels, plate fins, pin fins, or combination thereof. The heat sink 316 may be made of a thermally conductive material such as aluminum or copper. The heat sink 316 may be machined from a solid block of the thermally conductive material. In some embodiments, the heat sink 316 may be forged, extruded, or 3D-printed. In some embodiments, the heat sink 316 and cold plate 310 may be formed from a single piece of thermally conductive material. In an embodiment where the cold plate 310 having a first major surface 312 and a second major surface 314 opposite the first major surface 312 and the heat sink 316 are formed as separate components, the heat sink 316 may be bonded to the second major surface 314 of the cold plate 310. Various bonding techniques may be implemented to bond the heat sink 316 to the second major surface 314 of the cold plate 310. For example, metal to metal brazing, soldering, sintering, or other bonding processes may be implemented.

Figure 6A:
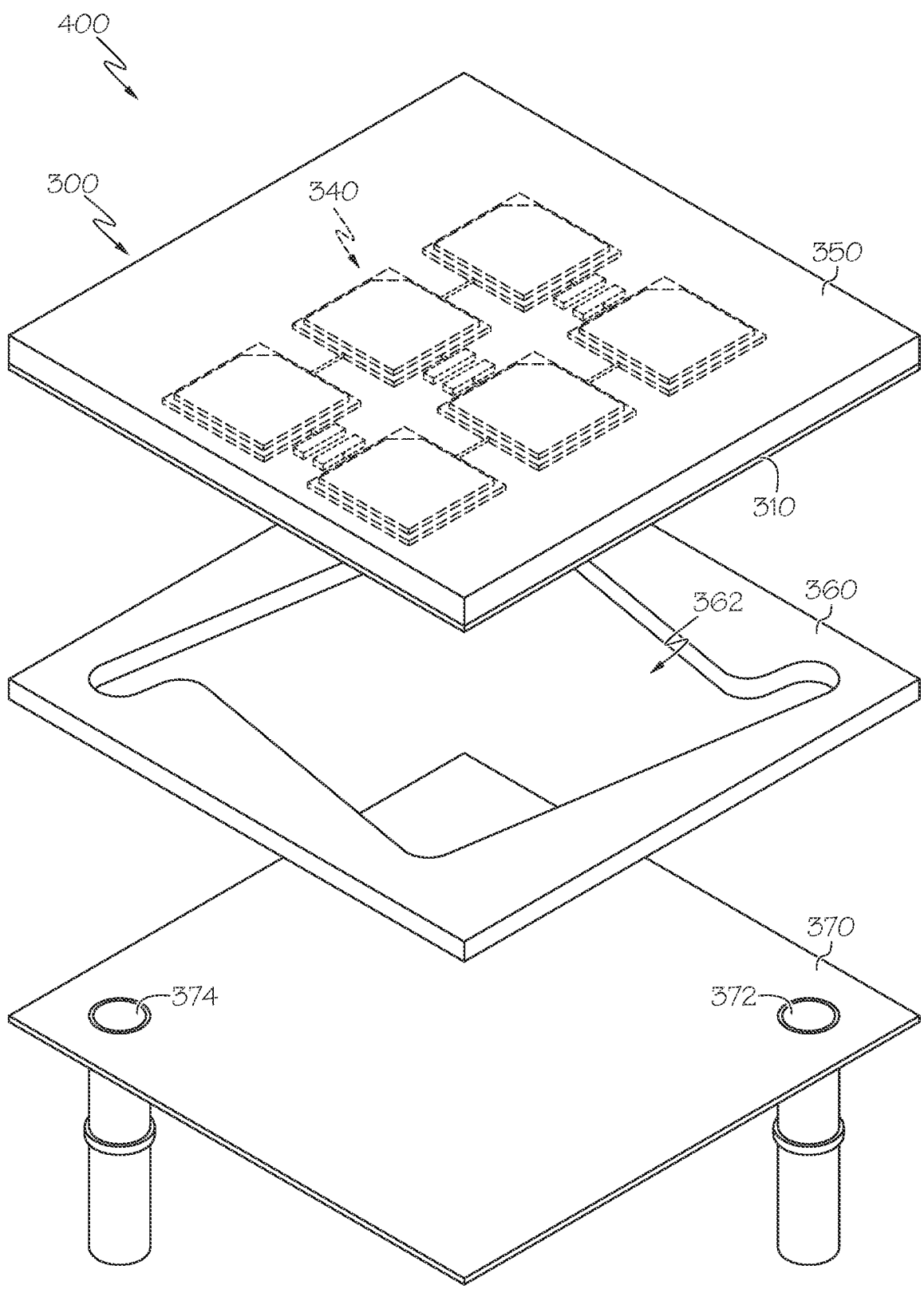
FIG. 6A depicts a perspective exploded view of an illustrative integrated power module including the integrated power electronics package according to one or more embodiments shown and described herein.

In some embodiments, once the heat sink 316 is formed and bonded to the cold plate 310, the heat sink assembly, for example, as depicted in FIG. 3, may be bonded or otherwise fastened to a cooling manifold 360 and a second cold plate 370 as depicted in FIG. 6A. However, when and/if the cold plate 310 is bonded or otherwise fastened to the cooling manifold 360 and the second cold plate 370 depends on the fabrication method that is implemented. For example, in some fabrication methods, the process may proceed from block 210 to block 220, such that the cold plate 310 is bonded or otherwise fastened to the cooling manifold 360 and the second cold plate 370 after a further fabrication process step. Bonding the cold plate 310 to the cooling manifold 360 and the second cold plate 370 is described in more detail with reference to block 240.

Figure 4A:
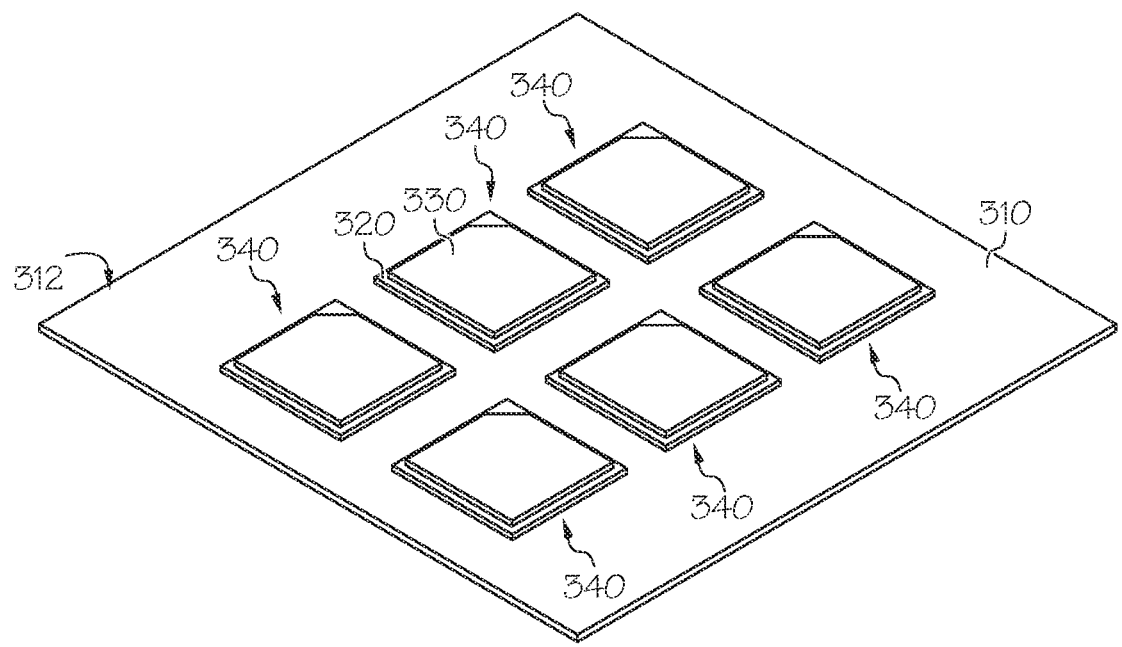
FIG. 4A depicts a top perspective view of the illustrative heat sink assembly depicted in FIG. 3 having a plurality of power devices bonded to the heat sink assembly according to one or more embodiments shown and described herein.
Figure 4B:
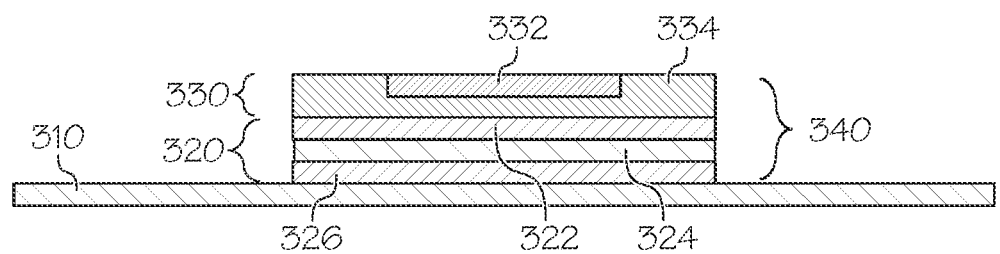
FIG. 4B depicts a side cross-sectional view of the illustrative heat sink assembly depicted in FIG. 3 having a plurality of power devices bonded to the heat sink assembly according to one or more embodiments shown and described herein.

Blocks 212, 214, 216, and 220 of FIG. 2 are now described with reference to FIGS. 4A and 4B. FIGS. 4A and 4B depict a top perspective view of the illustrative heat sink assembly having a plurality of power devices 332 and/or power devices 332 configured within a substrate 334 bonded to the heat sink assembly and a side cross-sectional view of the illustrative heat sink assembly, respectively. At block 212, in some embodiments, a sub process of assembling a power module 340 is completed so that the power module 340 is bonded to the cold plate 310 of the heat sink assembly. For example, the sub process of assembling a power module 340, in some embodiments, includes bonding a power device 332 to a substrate 334 to form a device stack 330, at block 214 and bonding the substrate 334 to a direct bonded copper (DBC) device 320 or similar device. The power device 332 may be bonded to the substrate 334 using silver sintering or other bonding techniques such as transient liquid phase (TLP) bonding or the like. The substrate 334 may be a bulk copper component having a cavity for receiving the power device 332. In some embodiments, the substrate 334 may be a vapor chamber or other solid heat-spreading device to improve the heat spreading within the printed PCB 350. The substrate 334 may have a larger footprint than the power device 332 to enable spreading of heat across a larger surface than the footprint of the power device 332.

In other embodiments, the sub process of assembling a power module 340, at block 212, includes bonding the power device 332 directly to the DBC device 320. That is, the power module 340 does not include a substrate 334 such as a bulk copper component having a cavity formed therein for receiving the power device 332. As used herein, the DBC device 320 includes a ceramic tile 324 having a first sheet 322 of copper or aluminum bonded to one side and a second sheet 326 of copper or aluminum bonded to the opposite side of the ceramic tile 324. The first and second sheets 322 and 326 may be bonded to ceramic tile 324 by high-temperature oxidation process. It should be understood that DBC devices 320 are implemented for their excellent electrical insulation and good heat spreading characteristics. As such, other devices having similar or better electrical insulation and heat spreading characteristics to those of DBC device 320 may be implemented in place of the DBC device 320 described herein.

The power devices 332 may include, for example, one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, at least one of the plurality of power devices 332 may include a wide-bandgap semiconductor, and may be formed from any suitable material such as, but not limited to, silicon carbide (SiC), silicon dioxide (SiO2), aluminum nitride (AlN), gallium nitride (GaN), and boron nitride (BN), and the like. In some embodiments, the plurality of power devices 332 may operate within a power module having a high current and/or a high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween) and under high temperatures (for example, in excess of 100° C., 150° C., 175° C., 200° C., 225° C., or 250° C.) and generate a large amount of heat that must be removed for the continued operation of the power module 340 (including the power devices 332).

With a power module 340 assembled, the method 200 proceeds to block 220, where the power module 340 or plurality of power modules 340 are bonded to the first major surface 312 of the cold plate 310. The DBC device 320 portion of the power module 340 may be sintered, soldered, transient liquid phase (TLP) bonded or similarly bonded to the cold plate 310. For example, in embodiments, the cold plate 310 includes a plurality of power devices 332 coupled thereto via their corresponding power module 340. With the power module 340 bonded directly to the cold plate 310, insulation layers or conductive vias formed within a laminated PCB are not needed. Additionally, the cold plate 310 provides a rigid build surface for 3D-printing the PCB one and around the power devices 332 bonded thereto.

In some embodiments, once the power modules 340 are bonded to the first major surface 312 of the cold plate 310 at block 220, the heat sink assembly, for example, as depicted in FIG. 3, may be bonded or otherwise fastened to a cooling manifold 360 and a second cold plate 370 as depicted in FIG. 6A. However, when and/if the cold plate 310 is bonded or otherwise fastened to the cooling manifold 360 and the second cold plate 370 depends on the fabrication method that is implemented. For example, in some fabrication methods, the process may proceed from block 220 to block 230, such that the cold plate 310 is bonded or otherwise fastened to the cooling manifold 360 and the second cold plate 370 after a further fabrication process step. Bonding the cold plate 310 to the cooling manifold 360 and the second cold plate 370 is described in more detail with reference to block 240.

Figure 5A:
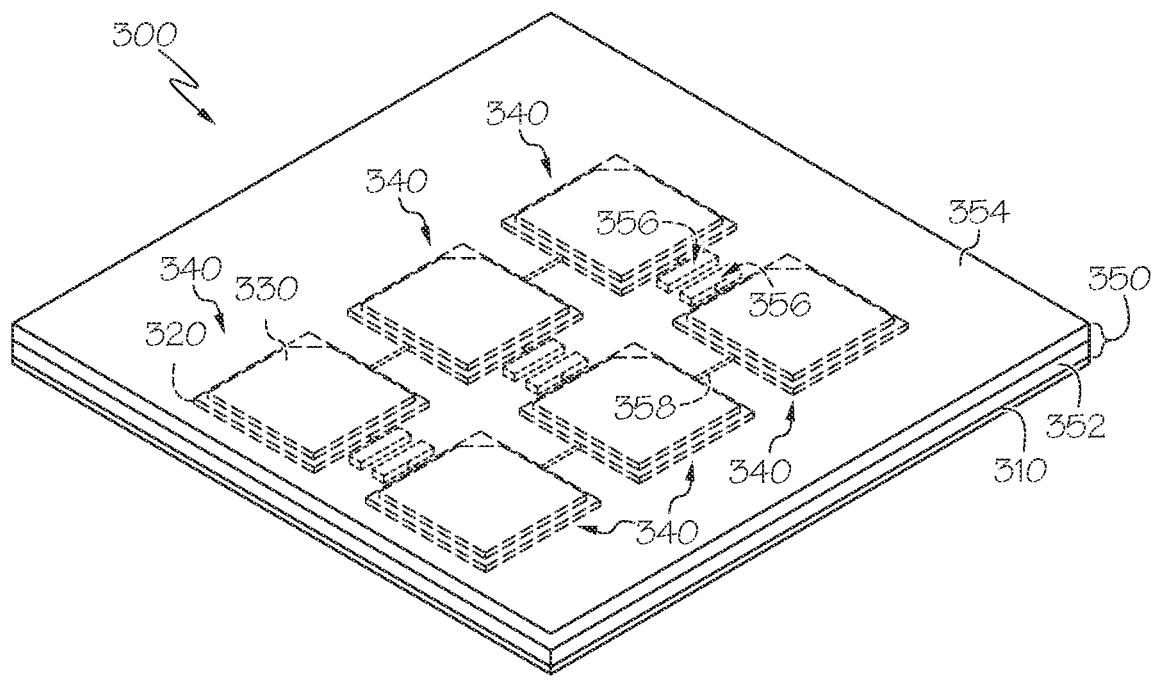
FIG. 5A depicts a perspective view of an illustrative integrated power electronics package having a PCB formed by 3D-printing the PCB on and/or around power devices that are bonded to a heat sink assembly according to one or more embodiments shown and described herein.
Figure 5B:
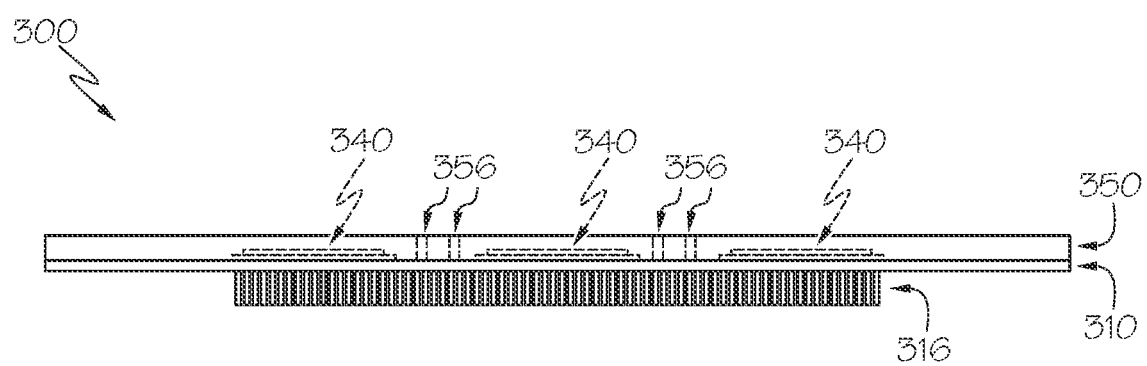
FIG. 5B depicts a side cross-sectional view the illustrative of the integrated power electronics package depicted in FIG. 5A according to one or more embodiments shown and described herein.

Block 230 of FIG. 2 is now discussed with reference to FIG. 5A, which depicts a perspective view of an illustrative integrated power electronics package 300 having a PCB formed by 3D-printing the PCB on and/or around power devices that are bonded to heat sink assembly and FIG. 5B, which depicts a side cross-sectional of the integrated power electronics package depicted in FIG. 5A. At block 230, an electronic controller 102 causes a 3D-printer 105 to form a printed PCB 350 having conductive portions and insulation portions on the cold plate 310 and on and/or around the power device 332 that is bonded to the cold plate 310. As briefly discussed hereinabove, the 3D-printer 105 executes the 3D-printing instructions 138b that correspond to a particular PCB design 138a to deposit conductive material and/or insulating material in unconstrained patterns thereby forming conductive portions and insulating portions of a PCB 350. The conductive portions include conductive pads 356 and/or conductive paths 358 providing electrical and/or thermal paths within the PCB 350. In particular, FIG. 5A depicts a PCB having a first portion 352 and a second portion 354 formed on top of the first portion 352. The first portion 352 depicts portions of the printed PCB 350 that are printed around the power modules 340. The second portion 354 depicts portions of the printed PCB 350 that are printed on and above the power modules 340. The first portion 352 may include conductive paths 358 interconnecting the power devices 332 of the power modules 340 together. The second portion 354 may include conductive paths 358 and pads 356 that in combination enable electrical connection from surface mounted components to the power devices 332 embedded within the printed PCB 350. It is understood that since the PCB is 3D-printed, the conductive pads 356 extending from the first portion 352 through the second portion 354 and optionally to the surface of the second portion 354 of the printed PCB do not include interceding insulation layers or the formation of vias formed using laser drilling or other machining and electroplating techniques. As such, a PCB may be formed directly on the cold plate 310 and on and/or around power devices 332 that are bonded thereto without the added processing steps of machining cavities within a laminated PCB for receiving the power devices 332 and/or laser drilling and electroplating to form electric and/or thermal conductive vias. In addition, by printing conductive portions with a 3D-printer, the process of printing the conductive material may include directly printing on the electrical connections of the power devices 332 thereby forming seamless electrical connections from the power devices 332 to the conductive paths 358 formed within the printed PCB 350. The combination of the cold plate 310, power modules 340 bonded thereto, and the printed PCB 350 printed thereon forms an integrated power electronics package 300. The integrated power electronics package 300 may further be coupled to a cooling assembly having a cooling manifold 360 and a second cold plate 370. The second cold plate 370 encloses the cooling manifold 360 such that a cooling fluid may be processed through a flow path or cavity 362 within the cooling manifold 360 thereby providing additional heat extraction from the heat sink 316 positioned within the cooling manifold 360. The cooling assembly will be described in more detail herein with reference to block 240 and FIGS. 6A and 6B.

Figure 6B:
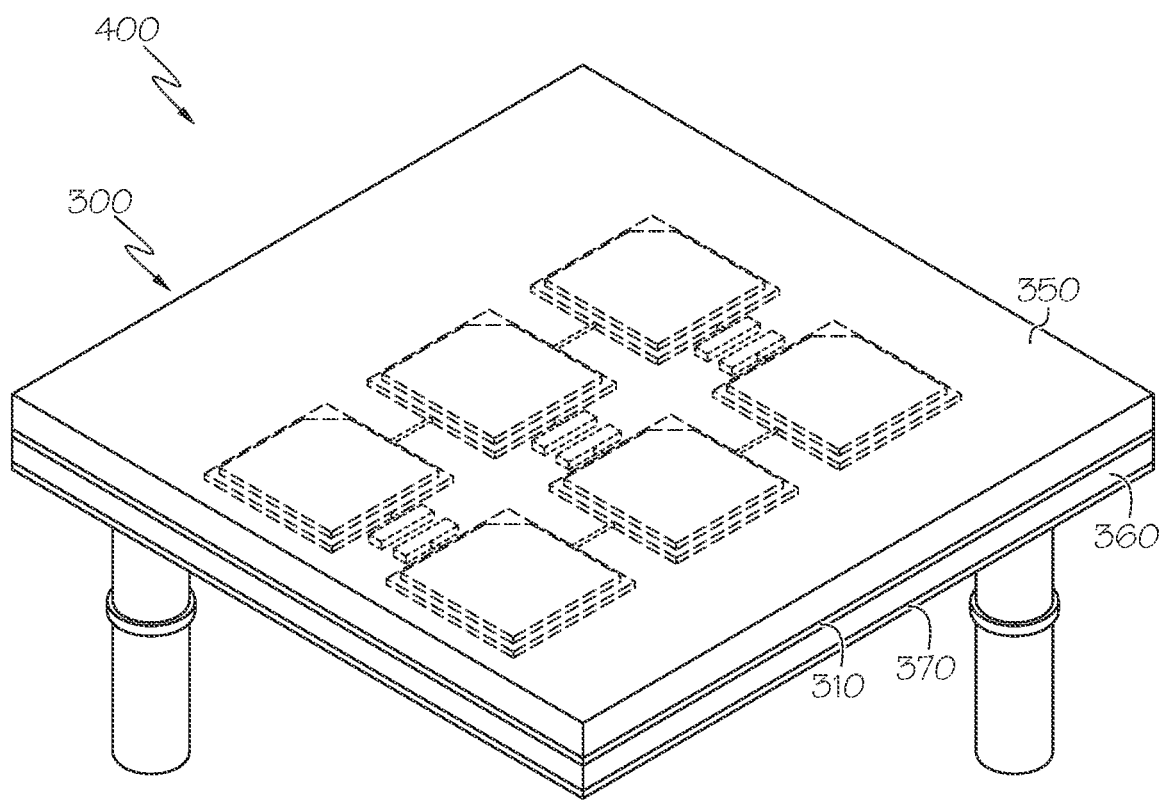
FIG. 6B depicts a perspective assembled view of the illustrative cooling assembly depicted in FIG. 6A according to one or more embodiments shown and described herein.

Block 240 of FIG. 2 is now discussed with reference to FIG. 6A, which depicts a perspective exploded view of an illustrative integrated power module including the integrated power electronics package and FIG. 6B, which depicts a perspective assembled view of the illustrative cooling assembly depicted in FIG. 6A. At block 240, the illustrative integrated power electronics package 300 is bonded to a cooling manifold 360 and second cold plate 370 thereby forming an integrated power module 400. As depicted in FIG. 6A, the cooling manifold 360 includes a fluid path or cavity 362 formed therein such that the heat sink 316 coupled to the second major surface 314 of the cold plate 310 can be received therein. The cooling manifold 360 may be made of a plastic or metal material. Accordingly, a boding technique such as a metal-plastic direct bonding process may be used to bond the cold plate 310 to the cooling manifold 360 when it is made of plastic. In other embodiments, a sintering, soldering, brazing, TLP, or similar binding process may be used to bond the cold plate 310 to the cooling manifold 360 when the cooling manifold 360 is a metal or similar material.

The second cold plate 370 includes an inlet 372 and an outlet 374. The inlet 372 and the outlet 374 are configured such that cooling fluid may be introduced through the inlet 372 into the cavity 362 of the cooling manifold 360. The cooling fluid flows through the cavity 362 of the cooling manifold 360 impinging the heat sink 316 and the second major surface of the cold plate 310 extracting heat therefrom. The cooling fluid may flow out of the cooling manifold 360 through the outlet 374 formed in the second cold plate 370. The inlet 372 and the outlet 374 may be fluidly coupled to a pump, condenser, reservoir, radiator, and/or other cooling system components. When assembled, as depicted in FIG. 6B, the combined thickness of the cold plate 310, cooling manifold 360, and the second cold plate 370 may be less than 15 mm, less than 10 mm, or about 5 mm.

Figure 7:
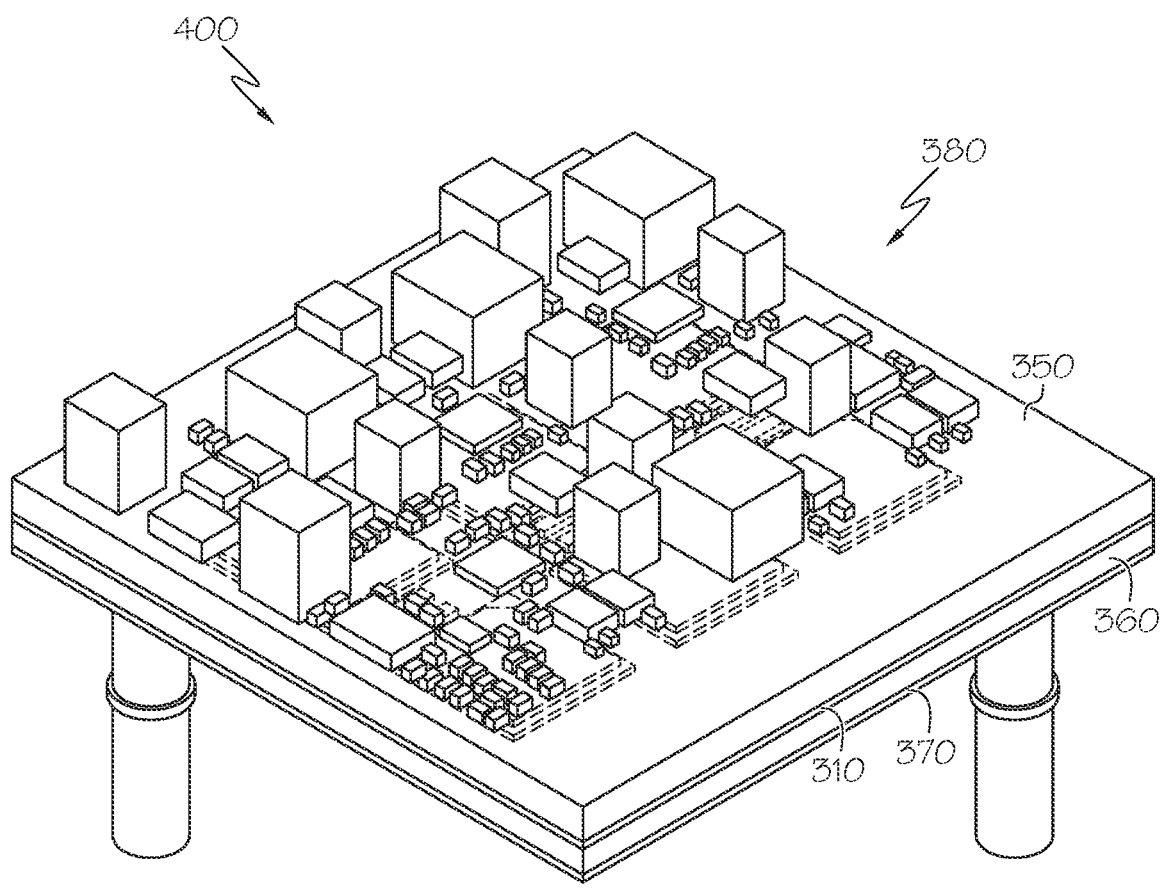
FIG. 7 depicts a perspective assembled view of the illustrative cooling assembly having electronic components coupled to the 3D-printed PCB of the integrated power electronics package according to one or more embodiments shown and described herein.

At block 250 of the method 200 depicted in FIG. 2, one or more passive and/or active electrical components 380 are mounted on the printed PCB 350 as shown, for example, in FIG. 7. The one or more passive and/or active electrical components 380 may be mounted using a pick-and-place operation or manually soldered thereon. The one or more passive and/or active electrical components 380 may provide logic control and/or switching functionality to and from the power devices 332 embedded within the printed PCB 350 enabling a variety integrated power modules 400. The integrated power modules 400 may be a power converter, an inverter, a drive circuit or the like for powering one or more components of an electric vehicle, for example.

It should be understood that some steps of the aforementioned process may be omitted or performed in a variety of orders while still achieving the object of the present disclosure. Some of the functional blocks and/or flowchart elements described herein may be translated into machine-readable instructions. As non-limiting examples, the machine-readable instructions may be written using any programming protocol, such as: descriptive text to be parsed (e.g., such as hypertext markup language, extensible markup language, etc.), (ii) assembly language, (iii) object code generated from source code by a compiler, (iv) source code written using syntax from any suitable programming language for execution by an interpreter, (v) source code for compilation and execution by a just-in-time compiler, etc. Alternatively, the machine-readable instructions may be written in a hardware description language (HDL), such as logic implemented via either a field programmable gate array (FPGA) configuration or an application-specific integrated circuit (ASIC), or their equivalents. Accordingly, the functionality described herein may be implemented in any conventional computer programming language, as pre-programmed hardware elements, or as a combination of hardware and software components.

It should now be understood that embodiments described herein are directed to systems and methods of forming integrated power electronics packages by 3D-printing the PCB on and/or around power devices and forming integrated power devices and integrated power modules therefrom. For example, a method of forming integrated power electronics packages by 3D-printing the PCB may include bonding one or more power devices to a first surface of the cold plate and printing, using a 3D-printer, a circuit board on and/or around the one or more power devices such that the circuit board includes one or more insulating portions and one or more conductive portions interconnecting the one or more power devices, thereby forming an integrated power electronics package. The integrated power electronics package may be further bonded to a cooling assembly that provide a cooling fluid to interface with the cold plate to remove excess unwanted heat from the integrated power electronics package. Additionally, the method may further include mounting one or more electrical components to the surface of the 3D-printed PCB as described in detail herein.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method, comprising:
bonding a power device configured to operate at 5 kW or greater to a first surface of a cold plate via a sinter, solder, or transient liquid phase bond, the power device defining a layer above and adjacent to the first surface of the cold plate, thereby providing direct thermal connection between the power device and the first surface of the cold plate; attaching a second cold plate to the cold plate, wherein the second cold plate comprises an inlet and an outlet; and
printing, using a 3D-printer, a circuit board on and around the power device such that the circuit board includes one or more insulating portions and one or more conductive portions.

2. The method of claim 1, further comprising forming a heat sink assembly including a heat sink device on a second surface of the cold plate.

3. The method of claim 1, further comprising bonding a second surface of the cold plate to a manifold of a cooling assembly.

4. The method of claim 3, wherein the manifold includes an inlet fluidly coupled to an outlet such that cooling fluid is capable of flowing from the inlet over the second surface of the cold plate and out the outlet.

5. The method of claim 1, further comprising mounting electronic components to the circuit board.

6. The method of claim 1, wherein bonding the power device to the first surface of the cold plate includes bonding the power device directly to the cold plate.

7. The method of claim 1, wherein bonding the power device to the first surface of the cold plate includes bonding the power device to a heat spreader and bonding the heat spreader to the cold plate.

8. The method of claim 7, wherein the heat spreader is a vapor chamber.

9. The method of claim 1, wherein bonding the power device to the first surface of the cold plate includes bonding the power device to the cold plate via a direct bonded copper device.

* * * * *